(12) United States Patent
Bhatti et al.

(10) Patent No.: US 6,615,911 B1
(45) Date of Patent: Sep. 9, 2003

(54) HIGH PERFORMANCE LIQUID-COOLED HEAT SINK WITH TWISTED TAPE INSERTS FOR ELECTRONICS COOLING

(75) Inventors: Mohinder Singh Bhatti, Amherst, NY (US); Frederick Vincent Oddi, Orchard Park, NY (US); Shrikant Mukund Joshi, Williamsville, NY (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/093,026

(22) Filed: Mar. 7, 2002

(51) Int. Cl.⁷ .............................. H05K 7/20; F28F 3/12; F28F 13/12
(52) U.S. Cl. .................... 165/80.4; 165/109.1; 165/168; 138/38; 257/714; 361/699
(58) Field of Search ................................ 165/80.4, 177, 165/168, 109.1; 361/699; 257/714; 138/38

(56) References Cited

U.S. PATENT DOCUMENTS

| | | | | |
|---|---|---|---|---|
| 1,056,373 A | * | 3/1913 | Segelken | 165/177 |
| 1,961,744 A | * | 6/1934 | Durkee | 138/38 |
| 2,864,405 A | * | 12/1958 | Young | 165/109.1 |
| 3,579,162 A | * | 5/1971 | Savkar | 165/109.1 |
| 3,636,982 A | * | 1/1972 | Drake | 165/109.1 |
| 3,926,510 A | * | 12/1975 | Locke et al. | 165/168 |
| 5,199,487 A | * | 4/1993 | DiFrancesco et al. | 165/168 |
| 5,307,867 A | * | 5/1994 | Yasuda et al. | 165/109.1 |
| 5,636,684 A | * | 6/1997 | Teytu et al. | 165/80.4 |

FOREIGN PATENT DOCUMENTS

GB 588857 * 6/1947 ................. 165/177

* cited by examiner

Primary Examiner—Leonard R. Leo
(74) Attorney, Agent, or Firm—Patrick M. Griffin

(57) ABSTRACT

A liquid-cooled heat sink for use in combination with a heat exchanger to cool electronic or electrical devices attached to said heat sink comprises a metal block having a plurality of circular passageways therethrough defined by cylindrical walls. An inlet is in fluid communication with one end of the passageways for receiving a cooling liquid, and an outlet is in fluid communication with an opposite end of the passageways for outputting the cooling liquid. At least one tape insert is mounted within at least one of the circular passageways, wherein the tape insert longitudinally bisects the circular passageway and further wherein edges of the tape insert abut cylindrical wall.

6 Claims, 2 Drawing Sheets

HIGH PERFORMANCE LIQUID-COOLED HEAT SINK WITH TWISTED TAPE INSERTS FOR ELECTRONICS COOLING

TECHNICAL FIELD

The present invention is directed to heat sinks in general, and more particularly to liquid cooled heat sinks for use in dissipating waste heat generated by electrical or electronic components and assemblies.

BACKGROUND OF THE INVENTION

Research activities have focused on developing heat sinks to efficiently dissipate heat from highly concentrated heat sources such as microprocessors and computer chips. These heat sources typically have power densities in the range of about 5 to 35 W/cm$^2$ (4 to 31 Btu/ft$^2$s) and relatively small available space for placement of fans, heat exchangers, heat sinks and the like.

Existing heat sinks for microelectronics cooling have generally used air to directly remove heat from the heat source. However, air has a relatively low heat capacity. Such heat sinks are suitable for removing heat from relatively low power heat sources with power density in the range of 5 to 15 W/cm$^2$ (4 to 13 Btu/ft$^2$s). With increase in computing speed the power density of the heat sources has increased to 20 to 35 W/cm$^2$ (18 to 31 Btu/ft$^2$s) requiring more effective heat sinks. Liquid-cooled heat sinks employing high heat capacity fluids like water and water-glycol solutions are more particularly suited to remove heat from high power density heat sources. The cooling liquid used in these heat sinks removes heat from the heat source and is then transferred to a remote location where the heat can be easily dissipated into a flowing air stream with the use of a liquid-to-air heat exchanger. Thus, such heat sinks can be characterized as indirect heat sinks.

A typical liquid-cooled heat sink for microelectronics according to the prior art is shown in FIG. 1, and generally comprises a metal block 10 with drilled passages 12. The passages 12 are connected in a serpentine pattern by means of hairpin tubes 14 to form a continuous passage. The microelectronics device 16 is bonded to one face of the block and liquid coolant flows through the drilled passages 12 and hairpin tubes 14. Block 10 can have one or multiple microelectronics devices bonded to a face of the block. Heat sinks of this type have also used a serpentine tube mounted to one side of a block with the microelectronics device bonded onto the other side of the block. These types of heat sinks, however, have limitations to the density of passages 12 therethrough and must be spaced according to the relatively large bend radii of the hairpin tubes 14.

Therefore, these prior art heat sinks exhibit a relatively low heat transfer capability due to wide spacing of the serpentine flow passages, relatively low heat transfer area and low heat transfer coefficient. The conduction losses in the solid base construction of the heat sink further reduces the available thermal potential for heat transfer between the wall and fluid. Also, such heat sinks tend to be relatively heavy and thus introduce undesirably high mechanical stresses on the electronic devices being cooled and the circuit boards-to which the heat sink is attached. In addition, such heat sinks are limited in their ability to extract heat at low range of heat flux through the microelectronics device.

SUMMARY OF THE INVENTION

One aspect of the present invention is a liquid-cooled heat sink for use in combination with a heat exchanger to cool electronic or electrical devices attached to said heat sink comprises a metal block having a plurality of circular passageways therethrough defined by cylindrical walls. An inlet is in fluid communication with one end of the passageways for receiving a cooling liquid, and an outlet is in fluid communication with an opposite end of the passageways for outputting the cooling liquid. At least one tape insert is mounted within at least one of the circular passageway, wherein the tape insert longitudinally bisects the circular passageway and further wherein edges of the tape insert abut cylindrical wall.

Another aspect of the present invention is a method of cooling an electrical or electronic device comprising the steps of providing a liquid cooled heat sink of the type including a block having an inlet in fluid communication with a first end of a plurality of parallel passageways therethrough defined by cylindrical walls wherein each passageway includes a tape insert therein and further having an outlet in fluid communication with an opposite end of the passageways. An electrical or electronic device is affixed to a face of the block with a heat conductive adhesive. A liquid coolant is input into the inlet and then caused to pass through the passageways. The liquid coolant is then expelled from the outlet.

These and other advantages of the invention will be further understood and appreciated by those skilled in the art by reference to the following written specification, claims and appended drawings.

DESCRIPTION OF THE PREFERRED EMBODIMENT

Figure 1:
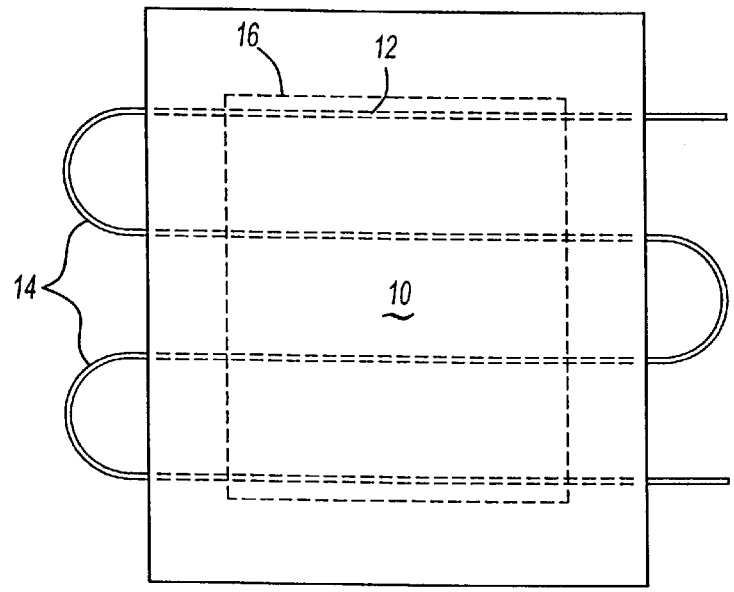
FIG. 1 illustrates a prior art liquid-cooled heat sink.
Figure 2:
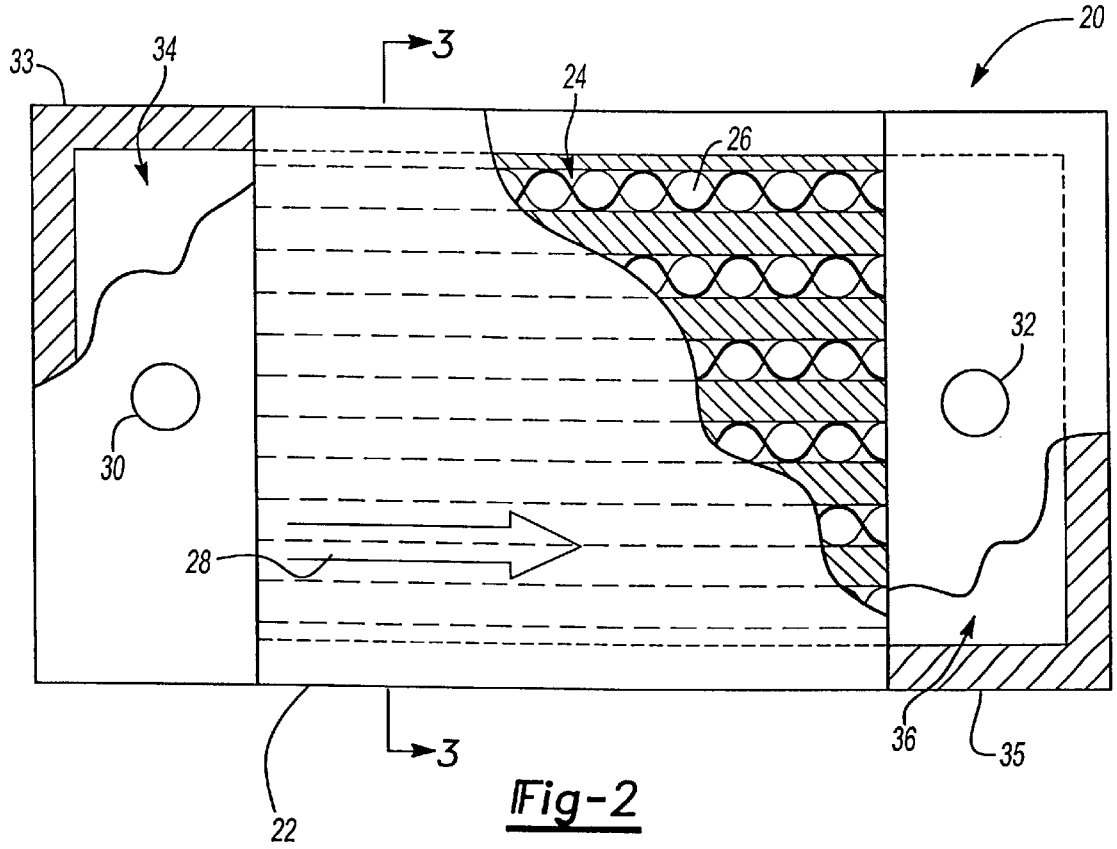
FIG. 2 is a partial sectional top view of the heat sink according to one embodiment of the present invention.

For purposes of description herein, the terms "upper", "lower", "left", "rear", "right", "front", "vertical", "horizontal", and derivatives thereof shall relate to the invention as oriented in FIG. 2. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 3:
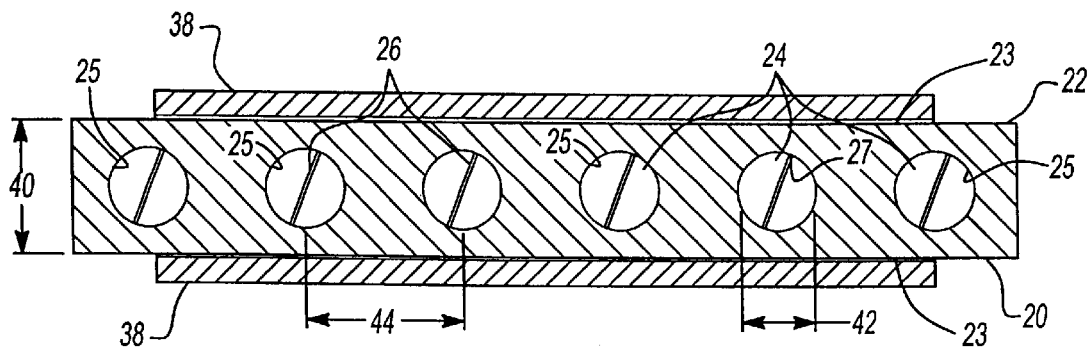
FIG. 3 is a cross sectional elevational view of the heat sink shown in FIG. 2 taken along the line 3—3 showing placement of the twisted tape inserts in the circular flow passages.

Heat sinks embodying the present invention, an example of which is shown in FIGS. 2 and 3, are especially useful in efficiently dissipating heat from highly concentrated heat sources such as microprocessors and computer chips operating under high heat flux conditions. Heat sinks according to the various embodiments disclosed herein may be used with microprocessors and computer chips (as well as other microelectronics) having any power density, and are particularly useful for microprocessors and computer chips having power densities of greater than about 10 W/cm² (9 Btu/ft²s). More importantly, heat sinks according to the various embodiments may be advantageously used to dissipate the higher heat flux demands of new computer chips having power densities of 20 to 35 watts/cm² (31 Btu/ft²s) as well as future chips having even higher heat flux demands.

Turning now to the drawings, FIGS. 2–3 illustrates a heat sink 20, which is one of the preferred embodiments of the present invention, and illustrates its various components.

Referring to FIGS. 2–3, heat sink 20 comprises a metal block 22 having a plurality of drilled circular passageways 24 therethrough. Inserted into each passageway is a twisted tape 26 having edges 27 contacting the circular passageway 24. Edges 27 may be adhesively or metallurgically bonded to the wall 25 defining passageway 24 at the points of contact for enhanced heat transfer. A liquid coolant flows through passageways 24 in the direction of the arrow 28. The metal block is further fitted with an inlet 30 and an outlet 32 for entry and exit of the liquid coolant to the interior of the flow passages 24. The inlet 30 provides access for the liquid coolant into inlet header 34 defined by inlet housing 33, which serves to distribute the liquid coolant across the plurality of circular passages 24. The liquid coolant flows through circular passages 24 in the direction of arrow 28 and gains heat along its path. Passages 24 discharge a hotter liquid coolant into outlet header 36 defined by outlet housing 35 which serves to collect the liquid coolant from the circular passages 24. The outlet 32 removes the heated liquid coolant from the outlet header 36 and transfers it to a remotely located air-cooled heat exchanger (not shown). The heat-generating element being cooled, such as a computer chip 38 is attached to the flat face of the metal block 22 with an intervening layer of thermal grease 23 or the like. For increased effectiveness of the heat sink 20, two heat-generating elements, such as electronic devices 38, may be attached to both flat surfaces of the metal block 22.

In order to minimize thermal resistance of the metal block 22, the block thickness 40 (represented by dimension 'a') is restricted to be no more than 1.1 to 1.4 times the flow passage diameter 42 (represented by dimension 'd'). Likewise, in order to maintain high heat flux from the concentrated heat source, such as electronic device 38, to the cooling fluid in the flow passages 24, the center-to-center distance 44 (represented by dimension 'c') of the flow passages should not exceed 1.1 to 1.4 times the flow passage diameter 42, and is more preferably at 1.3 time the flow passage diameter 42.

The components of heat sink 20 are preferably manufactured from a material exhibiting a high degree of heat conductivity such as aluminum or copper, and it is contemplated that the heat sink 20 may be wholly aluminum or copper, or a combination of different metal components. The components may be joined by any known means including metallurgical or adhesive bonding methods well known in the art. However, furnace brazing of the assembled heat sink is the preferred means since it reduces the contact resistance between the twisted tape inserts and the metal block.

Figure 4:
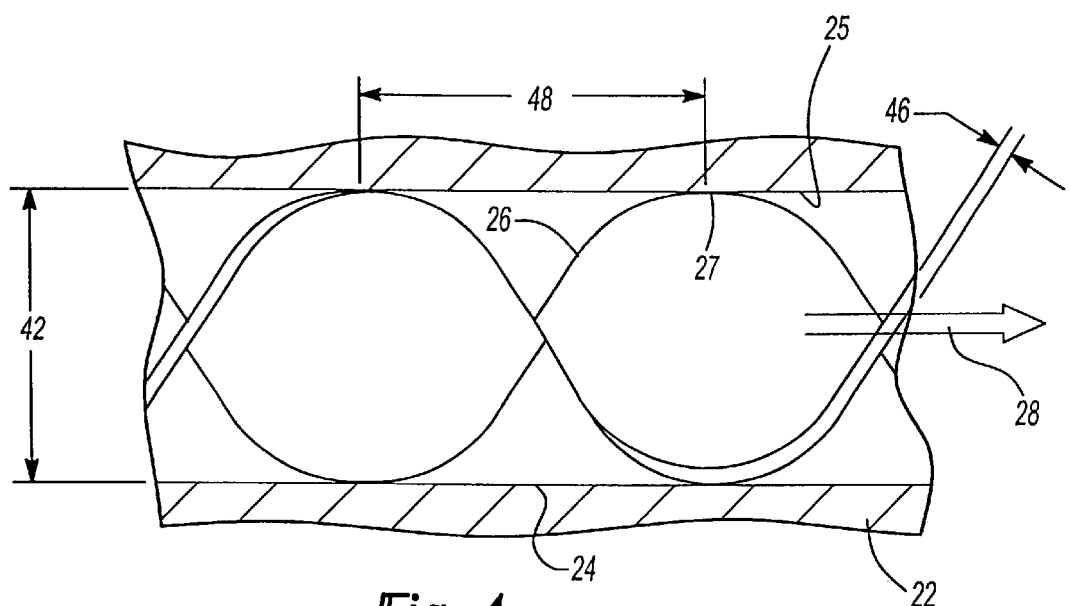
FIG. 4 is a plan view of a segment of one flow passage illustrating the plain twisted tape insert in relation to the circular flow passage.

Referring now to FIG. 4, the details of the plain twisted tape insert 26 in relation to the circular passage 24 housing the tape are illustrated. The precursor material for the twisted tape insert 26 is a plain strip of metal or plastic having a thickness 46 (represented by the dimension 'δ') and a width equal to the circular passage diameter 42. Preferably, the tape insert 26 has a thickness ranging from 0.05 mm to 0.5 mm. The twisted tape insert 26 is formed by twisting the strip about the circular passage axis so as to impart desired pitch 48 (represented by the dimension 'b') to the strip. The pitch 48 of the twisted tape 26 is simply the distance on the twisted tape insert surface in the flow direction 28 per each 180° of tape twist. As the ratio of the tape pitch 48 to the circular passage diameter 42, called tape twist ratio, tends to infinity, the circular passage assumes the form of two parallel semicircular passages. Preferably, the ratio of the pitch 48 of the twisted tape 26 to the diameter 42 of the passage 24 is between the values of 2 and 5. The tape insert after being twisted, as shown in cross-section in FIGS. 4 and 5, has tape faces corresponding to the twists in the tape insert.

Figure 5:
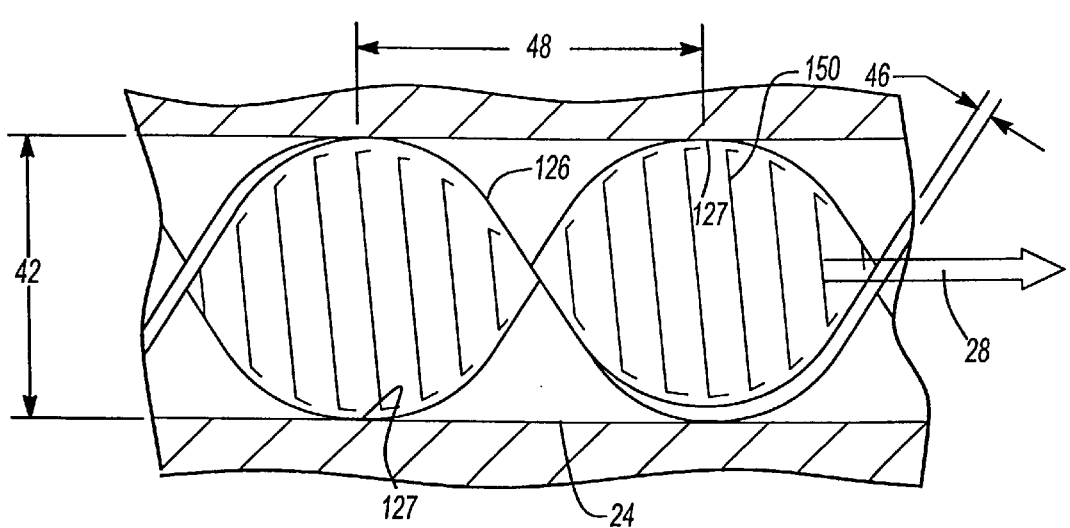
FIG. 5 is a plan view of a segment of one flow passage illustrating a louvered twisted tape insert in relation to the circular flow passage.

FIG. 5 shows an alternate embodiment 126 of the twisted tape insert. Twisted tape 126 is similar to the plain twisted tape insert 26 wherein edges 127 of twisted tape 126 are affixed to wall 25. Tape insert 126 further includes multiple louvers 150 extending substantially from edge 127 to edge 127 of tape 126 and thereby aligned normal to the flow direction 28 of the cooling fluid traversing passageways 24. These louvers 150 are intended to increase the heat transfer coefficient over and above that achieved by the twisting of the plain tape 26. Associated with an increase in heat transfer coefficient, louvered tape 126 also exhibits an increase in the friction factor between the fluid and tape 126. Since the friction factor of the plain twisted tape 26 is low, the increase in the friction factor of tape 126 due to the inclusion of louvers 150 does not entail a severe pressure drop penalty between inlet 30 and outlet 32.

In addition to the louvers 150, notches may be provided in the tape surface to promote turbulence in the cooling fluid stream with the objective of enhancing the heat transfer rate albeit at the expense of some pressure drop penalty.

The following relations govern design of the heat sinks of the present invention. The prescribed rate of generation of heat q̇ by the microelectronics heat source can be expressed via Newton's cooling law as:

$$\dot{q} = hA(T_w - T_m) \quad (1)$$

where h is the average heat transfer coefficient within the flow passages of the heat sink, A is the total heat transfer area, $T_w$ is the wall temperature of the heat sink and $T_m$ is the fluid mean temperature.

The average heat transfer coefficient h for the circular passage with a plain twisted tape insert under laminar flow conditions with uniform wall heat flux is expressible in terms of the dimensionless Nusselt number Nu as:

$$Nu \equiv \frac{hd}{k} = \\ 5.172 \left(1 + 1.39 e^{-2.4486 kd/k_t \delta}\right) \sqrt{1 + 0.005484 \left[Pr\left(\frac{Re}{b/d}\right)^{1.78}\right]^{0.7}} \quad (2)$$

where Pr and Re are the dimensionless Prandtl number and Reynolds number defined as:

$$Pr = \frac{\mu c_p}{k} \quad (3)$$

-continued $$Re = \frac{\rho u_m d}{\mu} \quad (4)$$

The various symbols in the foregoing relations carry the following meanings:

b is the tape pitch shown in FIG. 4
d is the tube diameter, which is equal to the tape width shown in FIG. 4
$\delta$ is the tape thickness shown in FIG. 4
$k_t$ is the thermal conductivity of the tape material
k is the thermal conductivity of the fluid
$\mu$ is the dynamic viscosity of the fluid
$\sigma$ is the fluid density
$c_p$ is the isobaric specific heat of the fluid
$u_m$ is the flow mean velocity through the flow passages.

The ratio b/d is referred to as the tape twist ratio. As shown in FIG. 4, it represents the distance on the twisted tape insert surface in the flow direction per 180° tape twist. As aforesaid, when b/d→∞, the passage shape assumes the form of two semicircular straight tubes in parallel.

The ratio $k_t\delta/kd$ in Equation (2) is the thermal conductance parameter. For relatively poor conducting tape materials, like plastics, $k_t\delta/kd$→0 while for highly conducting tape materials, like copper and aluminum, $k_t\delta/kd$→∞.

It may be noted that in the absence of the twisted tape insert, the Nusselt number Nu≡hd/k=48/11=4.3636 for the circular passage under laminar flow conditions with uniform wall heat flux and Nu≡hd/k=4.0890 for the semicircular passage under laminar flow conditions with uniform wall heat flux.

Equation (2) is valid for laminar flow with Re≤2,300 involving liquid or gas flow with uniform wall heat flux. For turbulent flow with Re≥4,000, the average heat transfer coefficient h for the circular passage with a plain twisted tape insert involving liquid flow with uniform wall heat flux is expressible in terms of the dimensionless Nusselt number Nu as:

$$Nu \equiv \frac{hd}{k} = 0.0259(1 + 1.39 e^{-2.4486 kd/k_t \delta})\left[1 + \left(\frac{\pi}{2b/d}\right)^2\right]^{2/5} Re^{4/5} Pr^{2/5} \quad (5)$$

where all the symbols have been previously defined.

For the transition flow regime (2,300≤Re≤4,000), the Nusselt number may be assumed to vary linearly with Re being bracketed by the values calculated using Equation (2) at Re=2,300 and Equation (5) at Re=4,000.

The average heat transfer coefficient h for the circular passage with a twisted tape insert with uniform wall temperature may be estimated by reducing the calculated values from Equations (2) and (5) by 17%.

The pressure drop ΔP in the circular passage with the twisted tape can be determined using the general relation:

$$\Delta P = \frac{2 f l \rho u_m^2}{g_c d} \quad (6)$$

where, in addition to the previously defined symbols, the remaining symbols have the following meanings:

f is the dimensionless friction factor
l is the total passage length in the flow direction
$g_c$=32.174 $(lb_m/lb_f)ft/s^2$ is the constant of proportionality in Newton's second law of motion.

Based on the analytical relations presented in the reference: R. K Shah and A. L. London, *Laminar Flow Forced Convection in Ducts*, pp. 379–384, Academic Press, N.Y., 1978, the friction factor f for the circular passage with the plain twisted tape insert under laminar flow conditions (Re≤2,300) is expressible as:

$$f = \frac{42.23\Phi}{Re} \text{ if } \frac{Re}{b/d} < 6.7 \quad (7)$$

$$f = \frac{38.4\Phi}{Re^{0.95}(b/d)^{0.05}} \text{ if } 6.7 \le \frac{Re}{b/d} \le 100 \quad (8)$$

$$f = \frac{\Phi\left(\frac{b}{d}\right)^{0.7}\left[8.8201 - 2.1193\left(\frac{b}{d}\right) + 0.2108\left(\frac{b}{d}\right)^2 - 0.0069\left(\frac{b}{d}\right)^3\right]}{Re^{0.7}} \text{ if } \frac{Re}{b/d} > 100 \quad (9)$$

The dimensionless factor Φ in the foregoing relations is given as:

$$\Phi = \left(\frac{\pi}{\pi+2}\right)^2 \left(\frac{\pi+2-2\delta/d}{\pi-4\delta/d}\right)^2 \left(\frac{\pi}{\pi-4\delta/d}\right) \quad (10)$$

where all the symbols have been previously defined.

It may be noted that in the absence of the twisted tape insert, the friction factor f=16/Re for the circular passage and f=15.767/Re for the semicircular passage under laminar flow conditions (Re≤2,300).

By the following example, the teachings of the present invention are illustrated to size a preferred heat sink by the use of the foregoing relations.

Example: A water-cooled heat sink of the present invention comprises an array of six circular tubes each of diameter d=0.375 inch drilled through the opposing sides of a metal block of thickness a=0.478 inch. Each tube is fitted with a plain aluminum tape of thickness δ=0.005 inch and the twist ratio b/d=3 in order to enhance the heat transfer rate in water flowing through the tubes.

The heat sink is intended to dissipate 400 Watts (0.3792 Btu/s) of power into water flowing through each tube at the rate ṁ=0.01 $lb_m$/s. This requires a heat dissipation rate q̇=0.0632 Btu/s in each of six tube. The incoming temperature $T_{wi}$ of water into the heat sink is 90° F. and the average tube wall temperature $T_w$ is 122° F.

The thermal conductivity of aluminum is $k_t$=2.22 Btu/ft s ° F. and the transport properties of water are as follows:

Density σ=62.34 $lb_m/ft^3$
Thermal conductivity k=0.000095 Btu/ft s ° F.
Isobaric specific heat $c_p$=1.0 Btu/$lb_m$° F.
Dynamic viscosity $\mu$=0.000754 $lb_m$/ft s
Prandtl number Pr=$\mu c_p$/k=7.94.

The flow mean velocity urn needed for the determination of the heat transfer coefficient h and the friction factor f is related to the prescribed mass flow rate ṁ, fluid density σ and the free flow area $A_c$ of each flow passage as $u_m$=ṁ/σ$A_c$. Neglecting the tape thickness 46 (δ) shown in FIG. 4, the free flow area $A_c$ of each tube is simply the cross sectional area of the tube given as $A_c$=$\pi d^2$/4. Introducing the tube diameter d=0.375/12 ft, the tube cross sectional area $A_c$=π(0.375/12)²/4=0.000767 $ft^2$. Introducing this value of $A_c$ together with the values of ṁ=0.01 $lb_m$/s and σ=62.34 $lb_m/ft^3$ into the foregoing relation, $u_m$=0.01/(62.34×0.000767)=0.2091 ft/s.

Given the water density σ=62.34 $lb_m/ft^3$, dynamic viscosity $\mu$=0.000754 $lb_m$/ft s, flow mean velocity $u_m$=0.2091 ft/s and the tube diameter d=0.375/12 ft, the Reynolds number Re is calculated to be 541 with the use of Equation (4). This value of Re being ≦2,300, the flow is considered laminar.

Knowing the thermal conductivity of aluminum $k_t$=2.22 Btu/ft s °F., the thermal conductivity of water k=0.000095 Btu/ft s °F., the tape thickness δ=0.005 inch and the tube diameter d=0.375 inch, the value of the thermal conductance parameter $k_t$δ/kd=311. Using this value of $k_t$δ/kd together with the Reynolds number Re=541, the Prandtl number Pr=7.94 and the tape twist ration b/d=3, the Nusselt number Nu=hd/k is calculated to be 23.26 with the use of Equation (2) applicable to laminar flow.

Introducing the calculated value of Nu=23.26 together with the thermal conductivity of water k=0.000095 Btu/ft s °F. and the hydraulic diameter d=0.375/12 ft into the defining relation Nu=hd/k, the heat transfer coefficient h=23.26×0.000095/(0.375/12)=0.0707 Btu/s ft²° F.

In the absence of the twisted tape insert, the value of Nu is given as Nu=48/11=4.3636. Thus the presence of the twisted tape insert increases the Nusselt number and hence the heat transfer coefficient by a factor of 23.26/4.3636=5.33.

Next, in order to determine the heat transfer area A of each tube with the use of Equation (1), the fluid mean temperature $T_m$ is needed. Assuming the temperature gradients in the heat sink to be mild, the water mean temperature $T_m$ entering Equation (1) can be taken as the arithmetic mean of the water inlet temperature $T_{wi}$=90° F. and as yet undetermined water outlet temperature $T_{wo}$. This latter temperature can be determined using the simple energy balance $\dot{q}=\dot{m}c_p(T_{wo}-T_{wi})$ where the prescribed heat dissipation rate per tube $\dot{q}$=0.0632 Btu/s, the mass flow rate of water per tube $\dot{m}$=0.01 lb$_m$/s, the isobaric specific heat of water $c_p$=1.0 Btu/lb$_m$° F. and the water inlet temperature $T_{wi}$=90° F. Introducing these values into the simple energy balance, $T_{wo}$=96.32° F. whence $T_m$=(90+96.32)/2=93.16° F.

Using the prescribed heat dissipation rate per tube $\dot{q}$=0.0632 Btu/s, h=0.0707 Btu/s ft²° F., $T_w$=122° F. and $T_m$=93.16° F., the heat transfer area of each tube is obtained as A=0.0310 ft²=4.4640 in² with the use of Equation (1). This is practically the area $A_w$ of the tube wall assuming that the amount of heat conducted by the tape from the tube wall is negligible.

The tube length l in the flow direction is related to the tube wall area $A_w$ and the tube diameter d as l=$A_w$/πd. Introducing $A_w$=4.4640 in² and d=0.375 inch, the tube length l=3.7886 inch.

Finally, in order to find the pressure drop ΔP in the heat sink, the average friction factor f needs to be determined with the use of the applicable relation from among Equations (7)–(9). Noting that Re/(b/d)=541/3=180, the applicable relation for the determination of f is found to be Equation (9). Introducing the tape thickness δ=0.005 inch and the tube diameter d=0.375 inch, the dimensionless factor Φ is calculated to be Φ=1.0418 with the use of Equation (10). Introducing this value of Φ together with Re=541 and b/d=3 into Equation (10), f=0.1145.

In the absence of the twisted tape insert, the value of f is given as f=16/Re=16/541=0.0296. Thus the presence of the twisted tape insert increases the friction factor by a factor of 0.1145/0.0296=3.87. Compare this with an increase in the heat transfer coefficient by a factor of 5.33.

Using the calculated value of f=0.1145 together with l=3.7886, σ=62.34 lb$_m$/ft³, $u_m$=0.2091 ft/s, $g_c$=32.174 (lb$_m$/lb$_f$)ft/s² and d=0.375 inch, the pressure drop through each tube and hence through the heat sink is found to be ΔP=0.1961 lb$_f$/ft² via Equation (6). This is equivalent to 0.001362 pounds per square inch or 0.0376 inch water.

While the preferred embodiment of the present invention has been described so as to enable one skilled in the art to practice the heat sinks disclosed, it is to be understood that variations and modifications may be employed without departing from the concept and intent of the present invention as defined by the following claims. The preceding description is intended to be exemplary and should not be read to limit the scope of the invention. The scope of the invention should be determined only by reference to the following claims.

We claim:

1. A liquid-cooled heat sink for use with a cooling fluid and in combination with a heat exchanger to cool electronic or electrical devices attached to said heat sink, said heat sink comprising:

a metal block having a plurality of circular passageways extending from one end to another end of said metal block, said circular passageways being defined by cylindrical walls;

at least one tape insert having edges and being mounted within at least one of said circular passageways, wherein said tape insert longitudinally bisects said circular passageway and wherein said edges of said tape insert abut said cylindrical wall; and said tape insert being twisted about a longitudinal axis of said passageway for further increasing the amount of heat transferred and defining tape faces;

said tape faces having a plurality of louvers spaced closely from one another on each of said tape faces; and said plurality of louvers extending across said tape faces of said tape insert and being aligned normal to a flow of the cooling fluid such that said tape faces are substantially free of any surfaces parallel to the flow of the cooling fluid for continuously agitating the cooling fluid and increasing the turbulence of the cooling fluid which increases heat transfer from said heat sink to said cooling fluid.

2. A liquid-cooled heat sink according to claim 1 wherein said louvers open into the flow of the cooling fluid for increasing the turbulence of the cooling fluid.

3. A liquid-cooled heat sink according to claim 2 further including a ratio of a pitch of said twisted tape insert to a diameter of said circular passageway is between the values of 2 and 5.

4. A liquid-cooled heat sink according to claim 3 wherein said tape insert has a thickness ranging from 0.05 mm to 0.5 mm for optimizing the amount of heat transferred to said tape insert.

5. A liquid-cooled heat sink according to claim 4 wherein said tape insert extends continuously from one end of said metal block to the other end of said metal block.

6. A liquid-cooled heat sink according to claim 1 wherein said louvers extend continuously from one end of said tape insert to said other end of said tape insert spaced from one another by a predetermined distance.

* * * * *